United States Patent [19]
Botti et al.

[11] Patent Number: 5,621,352
[45] Date of Patent: *Apr. 15, 1997

[54] SELF-CONFIGURABLE, DUAL BRIDGE, POWER AMPLIFIER

[75] Inventors: Edoardo Botti, Vigevano; Guido Brasca, Varese, both of Italy

[73] Assignee: SGS-Thomson Microelectronics S.r.l., Agrate Brianza, Italy

[*] Notice: The term of this patent shall not extend beyond the expiration date of Pat. No. 5,365,188.

[21] Appl. No.: 517,239

[22] Filed: Aug. 21, 1995

Related U.S. Application Data

[63] Continuation of Ser. No. 286,706, Aug. 5, 1994, Pat. No. 5,444,417, which is a continuation of Ser. No. 192,858, Feb. 7, 1994, Pat. No. 5,365,188.

[30] Foreign Application Priority Data

Feb. 24, 1993 [EP] European Pat. Off. .............. 93830070

[51] Int. Cl.⁶ .................................................. H03F 3/68
[52] U.S. Cl. ......................... 330/51; 330/84; 330/124 R; 330/146; 330/295
[58] Field of Search .......................... 330/51, 84, 124 R, 330/146, 295; 381/28, 120, 121

[56] References Cited

U.S. PATENT DOCUMENTS 3,944,941  3/1976  Tsuda .......................... 330/51
4,494,077  1/1985  Fukaya et al. ................... 330/295
5,101,170  3/1992  Turazzina et al. ................ 330/146 X
5,194,821  3/1993  Brambilla et al. ................ 330/51
5,414,774  5/1995  Yumoto ........................ 381/28 X

FOREIGN PATENT DOCUMENTS 2452854  10/1980  France .

OTHER PUBLICATIONS

European Search Report from European Patent Application Number 93830070.4, filed Feb. 24, 1993.

Primary Examiner—James B. Mullins
Attorney, Agent, or Firm—David M. Driscoll; James H. Morris

[57] ABSTRACT

A self-configurable, dual bridge, power amplifier has a window comparator sensing the level of input signals fed to the amplifier which-drives a plurality of configuring switches capable of configuring the amplifier as a single bridge amplifier driving a first and a second loads connected in series or as two distinct bridge amplifiers each driving one of the two loads. As long as the two levels of the input signals remain comprised between a range defined by a negative voltage reference and a positive voltage reference, the amplifier is configured as a single bridge driving the two loads in series, thus reducing sensibly power dissipation. Several embodiments of the configuring means are shown.

25 Claims, 9 Drawing Sheets

5,621,352

SELF-CONFIGURABLE, DUAL BRIDGE, POWER AMPLIFIER

This application is a continuation of application Ser. No. 08/286,706, filed Aug. 5, 1994, now U.S. Pat. No. 5,444,417, which in turn is a continuation of application Ser. No. 08/192,858, filed Feb. 7, 1994 now U.S. Pat. No. 5,365,188.

BACKGROUND OF THE INVENTION

1. Field of the Invention

The present invention relates to a self-configurable, dual bridge, power amplifier and more particularly to a self-configurable, dual bridge, power amplifier having considerably reduced consumption relative to conventional dual bridge amplifiers having the same output power rating.

2. Discussion of the Related Art

In many applications and particularly in audio equipment, low frequency, power amplifiers that drive the loudspeakers very often use a bridge configuration. In a bridge configuration such as an integrated amplifier, for example, it is possible to achieve an output power rating of about 20 W. In contrast, an output power rating of about 5 W could be obtained by the same integrated amplifiers in a single-ended configuration.

Furthermore, the output power stages of car radios or of comparable audio systems often have four "channels": right-front, left-front, right-rear and left-rear which enable uniform sound diffusion throughout the compartment by adjusting each channel's attenuation.

Four, 20 W, power amplifiers may produce maximum power dissipation of about 48 W (4×12 W). Because of the required compactness of car radios and similar audio systems, effective power dissipation is difficult to achieve due to relatively high internal temperature generated within the apparatus. Additionally, high working temperature may be detrimental to a magnetic tape cassette or an optical compact disk (CD) contained within the drive cabinet of the audio apparatus.

From the above considerations, it is clear that there is a need or utility for a bridge amplifier which can provide substantially reduced power dissipation for a particular maximum power delivered to multiple external loads.

SUMMARY OF THE INVENTION

The above noted technical problems are substantially overcome by the circuit of the present invention based on a dual bride amplifier composed of four operational power amplifiers, which are connectable in either a first or a second configuration. In the first configuration, the functional circuit is equivalent to that of a single bridge amplifier driving a load equivalent to a first and to a second load, connected in series. In the second configuration, the circuit is functionally equivalent to that of two distinct bridge amplifiers, the first amplifier and the second amplifier driving the first load and the second load, respectively. A window comparator, i.e., a comparator having a dual threshold, generates a configuring signal for the four power amplifiers of either configuration, depending on the instantaneous value of the signals fed to two input terminals of the amplifier. The configuring devices may have a pair of switches, a single pole switch and a two-pole switch, respectively, driven by the signal generated by the window comparator. Furthermore, each switch may be functionally implemented with a plurality of monopolar switches, driving in phase opposition among each other by the comparator signal. Control of these switches may be achieved by employing the comparator in combination with driving inverters where necessary.

Basically, when the level of the signals fed to the two inputs of the window comparator have an amplitude that remains within the "window", as determined by the two threshold voltages of the comparator, i.e., by a negative threshold voltage and by a positive threshold voltage, the output signal of the comparator controls the positioning of the configuration elements and configures the amplifier as a single bridge amplifier driving a first and a second load connected in series. When the instantaneous value of at least one of the input signals rises above a certain pre-established (absolute) level, the comparator changes state and causes the positioning of the configuring switches to two distinct bridge amplifiers, the first and second amplifiers driving the first and second loads, respectively. It is evident that as long as the instantaneous level of the signals remains within the "window" of the comparator, the dissipation remains equal to about a quarter of the dissipation of two distinct bridge amplifiers driving distinct loads. Therefore, a net decrease of the working dissipation of the dual bridge amplifier is achieved.

BRIEF DESCRIPTION OF THE DRAWINGS

The different aspects and advantages of the invention will become more evident through the following description of several important embodiments and by referring to the circuit diagrams shown in the attached drawings, wherein.

For purely illustrative purposes, the self-configurable dual bridge amplifier shown in the figures may represent a power audio amplifier 6f one of two stereo channels of an audio amplifier. The input signals that are fed to the two terminals IN-F and IN-R of the amplifier shown in the figure, may be substantially the same signals, eventually attenuated differently in order to drive a front and a rear channel, of one stereo channel. Nevertheless, the signals may also be different, although the maximum increase of efficiency, in terms of a reduced power dissipation, is obtained when the input signals as well as the loads that are represented in the figures by the two F and R (front and rear) loudspeakers are identical.

DETAILED DESCRIPTION

Figure 1:
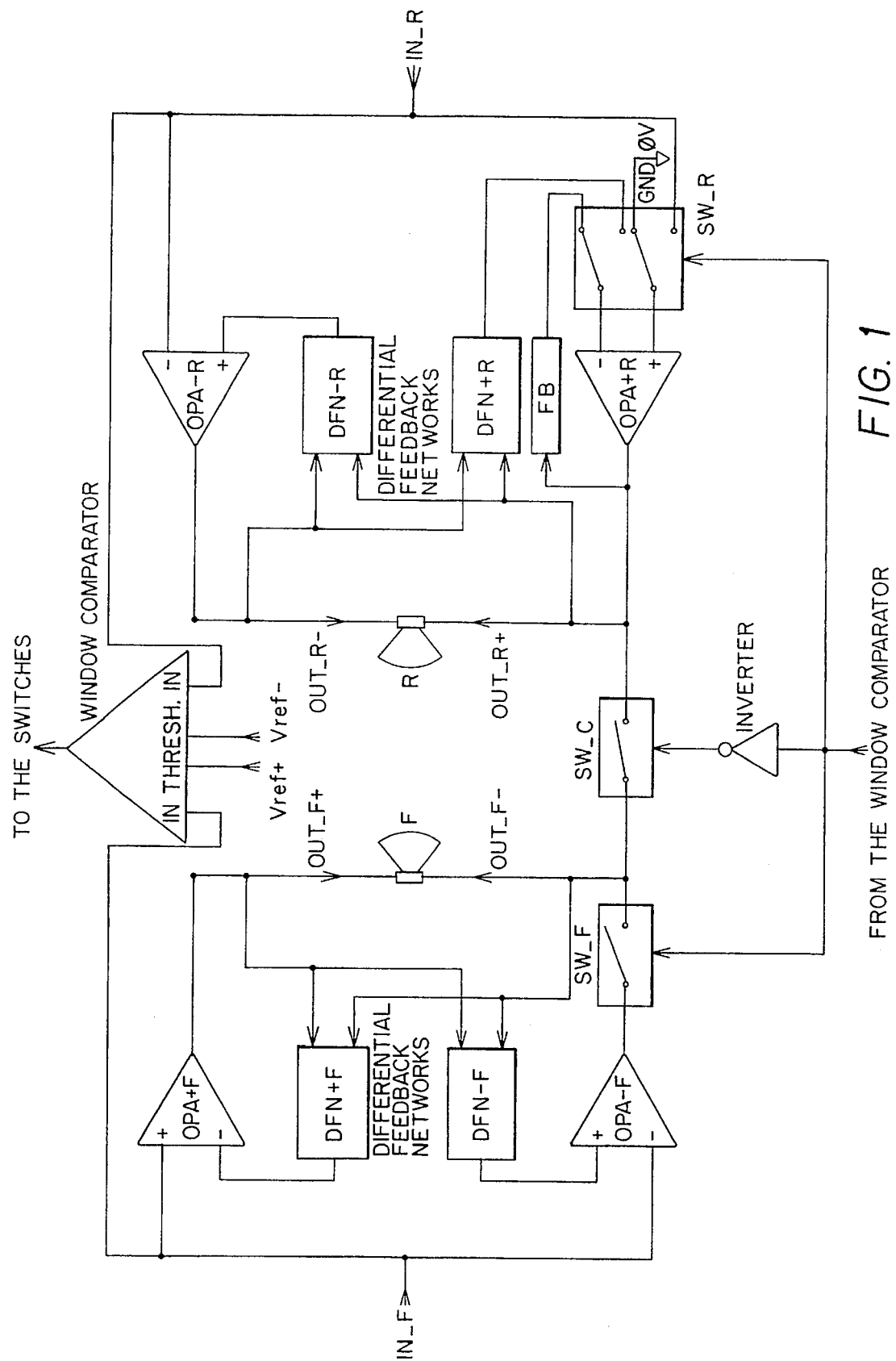
FIG. 1 is a functional block diagram of a self-configurable, dual bridge amplifier of the present invention.

The block diagram of FIG. 1 shows, in a schematic fashion, a self-configurable, dual bridge amplifier, made according to the present invention. Essentially the dual bridge amplifier of the invention comprises four power operational amplifiers: OPA+F, OPA−F and OPA−R, OPA+R. Each power amplifier is provided with its own differential feedback loop in accordance with a common practice, namely: DFN+F, DFN−F and DNF−R, DNF+R, respectively. The dual bridge amplifier further comprises a window comparator (WINDOW COMPARATOR), which drives a plurality of configuring switches, namely: SW_F, SW_C and SW_R.

The fourth power operational amplifier OPA+R is provided with an alternatively selectable, second feedback loop, permitting the amplifier to be configured as a buffer (unitary gain). Alternatively, this second feedback loop may be configured to use the first differential feedback loop DFN+R of the same amplifier, by positioning the configuring switches driven by the window comparator.

In strictly functional terms, the configuring elements may include a two-pole switch (SW_R) and a single-pole power switch, which in the functional diagram of FIG. 1 are represented by two power switches, namely SW_F and SW_C, driven in phase opposition by employing an inverter for driving the second (SW_C) of the two power switches. This second power switch (SW_C) connects in series the two loads. that are represented by the two loudspeakers F (for example the front-right loudspeaker) and R (for example the rear-right loudspeaker), respectively.

Essentially, the dual threshold comparator (window comparator) changes state (i.e., changes the logic level of the signal present on its output node) as a function of the instantaneous value of the signals that are fed to the two inputs of the comparator. In the embodiment shown in FIG. 1, the signals that are applied to the inputs of the configuring comparator are the same signals that are fed to the two inputs IN—F and IN—R of the amplifier. If the amplifier is implemented as the output stage of one of two stereo channels, the two input signals may be substantially identical to each other. The two signals may be attenuated differently from one another, for example by means of a dedicated control knob of the apparatus, that adjusts and optimize sound distribution in a certain interior. The dual triggering thresholds of the comparator, for instantaneous positive values and negative values, respectively; of the input signals, may be preset by applying two reference voltages: Vref+ and Vref−, which determine the respective thresholds of the comparator.

Figure 2:
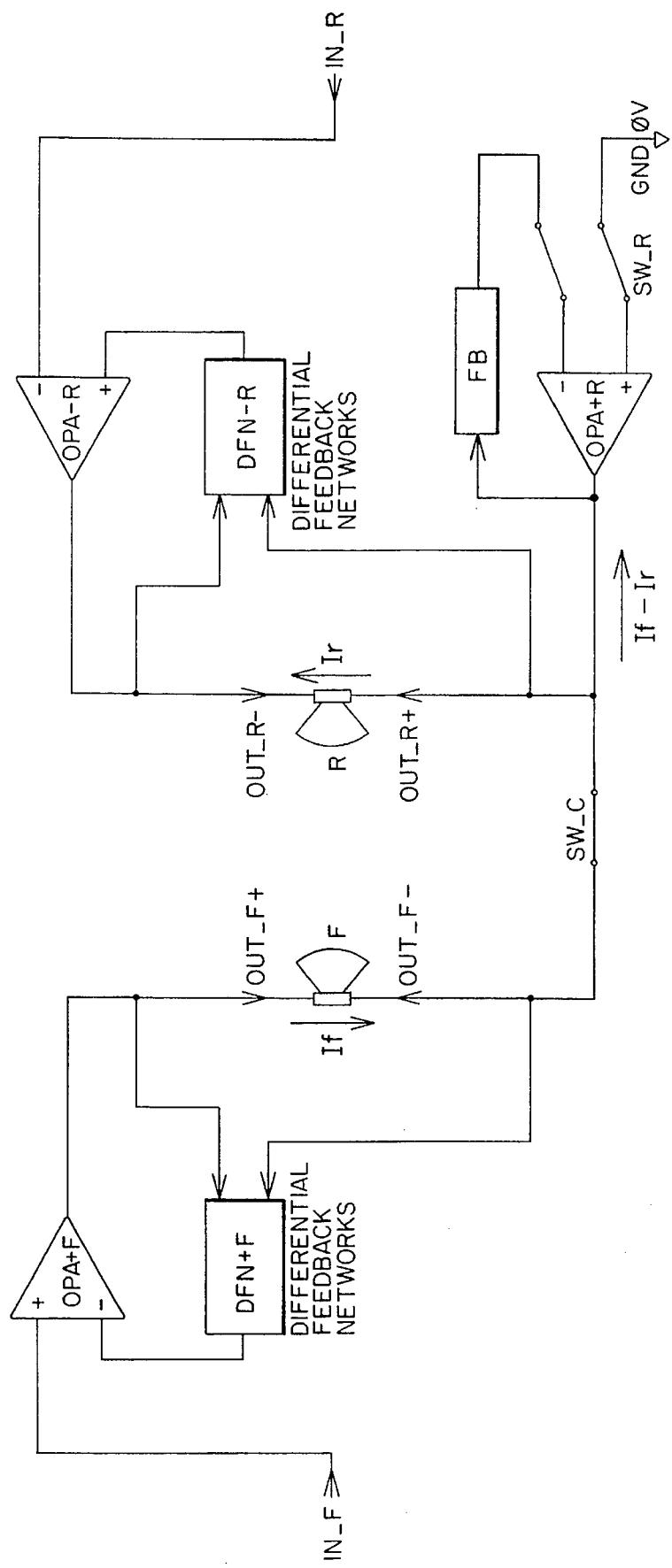
FIG. 2 is a functional diagram of the amplifier configured as a single bridge amplifier driving a load that is equivalent to a first load and a second load connected in series.

As long as the amplitude of the input signals remains within the "window" determined by the positive and negative thresholds (Vref+ and Vref−), the configuring elements will remain positioned so as to configure the functional circuit of the dual bridge amplifier as shown in FIG. 2.

In this configuration, when the signals that are fed to the inputs IN_F and IN_R of the amplifier are identical, the differential feedback lines and the operational power amplifiers are such that the signal generated on the output terminal OUR_F+ has the same amplitude and an opposite sign as the signal that is generated on the output terminal OUT_R−. Moreover, the fourth operational amplifier, OPA+R, functions substantially as a buffer, having its output node kept at ground potential, while the operational amplifier OPA−F (re: FIG. 1), is practically inactive (practically inexistent) because the switch SW_F is open.

In practice, the power switch SW_F connected to the output of the operational power amplifier OPA−F may be substantially eliminated and its function of "isolating" the respective operational power amplifier OPA−F may be virtually and conveniently performed by placing the amplifier in a state of a high output impedance, i.e., in a so-called tri-state condition.

In any case, in the configuration of FIG. 2 as assumed by the self-configurable, dual bridge amplifier of FIG. 1, the current that flows through the load F also feeds the load R.

Any difference in the current absorbed by the two loads is eventually absorbed by the buffer-configured operational amplifier OPA+R. Of course, if the loads and the signals are identical the difference of current absorbed by the two loads, namely: If-Ir will be virtually null. Therefore, under these conditions, the dissipated power will be equivalent to that of a single bridge amplifier driving a load having an impedance given by the following relation:

$$Requiv.=(R_F+R_R)$$

wherein RF and P,R are the internal resistances of the two loads F and R. This dissipated power is equal to a quarter of the power that would be dissipated by two distinct bridge amplifiers driving the same loads.

Figure 3:
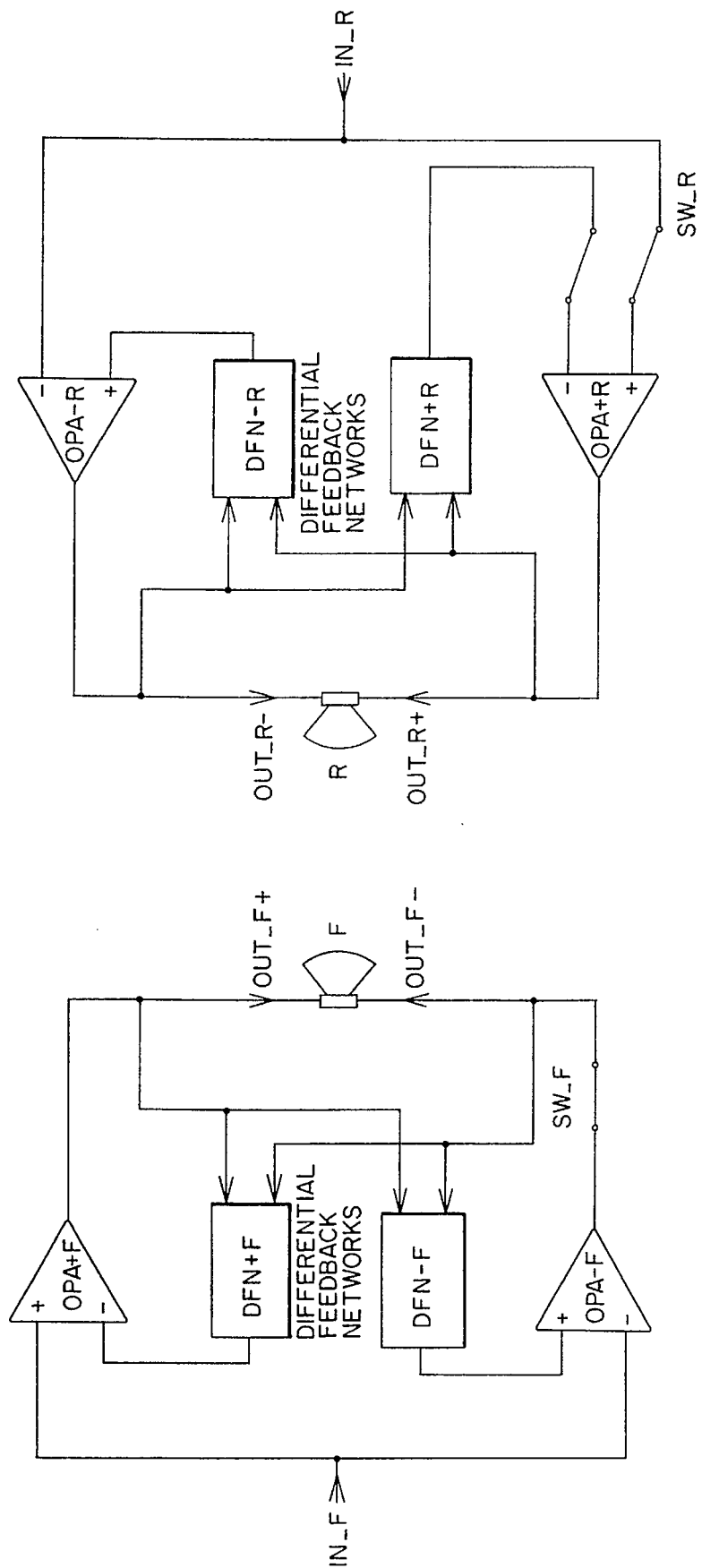
FIG. 3 is a functional diagram of the amplifier of the invention configured as two distinct bridge amplifiers, each driving one of the loads.

When the level of either of the two input signals reaches a value beyond either of the two thresholds (Vref+ and Vref−) that define the "window" of the comparator, the configuring elements change state thus determining a configuration of the circuit as depicted in FIG. 3, which represents a normal dual bridge configuration, wherein two, essentially distinct, bridge amplifiers drive their respective loads.

As may be observed from the functional diagrams, the differential feedback of the power operational amplifiers is derived from a load-connection node so that the gain will remain substantially constant notwithstanding a change of configuration. Moreover, an eventual nonlinearity of the power switch SW_C (FIG. 1) will not induce distortion effects.

Although the dual threshold comparator (WINDOW COMPARATOR) that drives the configuring elements (SW_F, SW_C and SW_R) is subject to output state transitions depending on the instantaneous amplitude of the signals fed to the inputs of the amplifier, this does not imply necessarily that the signals fed to the inputs of the amplifier be fed also to the inputs of the comparator. An alternative embodiment of the invention is depicted in the block diagram of FIG. 4, wherein the signals that are actually fed to the inputs of the configuring comparator (window comparator) are derived from the respective connection nodes of the loads F and R, instead of from the input nodes IN_F and IN_R of the amplifier. This alternative embodiment may be appropriate when the feedback lines DFN+F and DFN−R are insensitive to direct coupling with the input nodes of the comparator.

Figure 4:
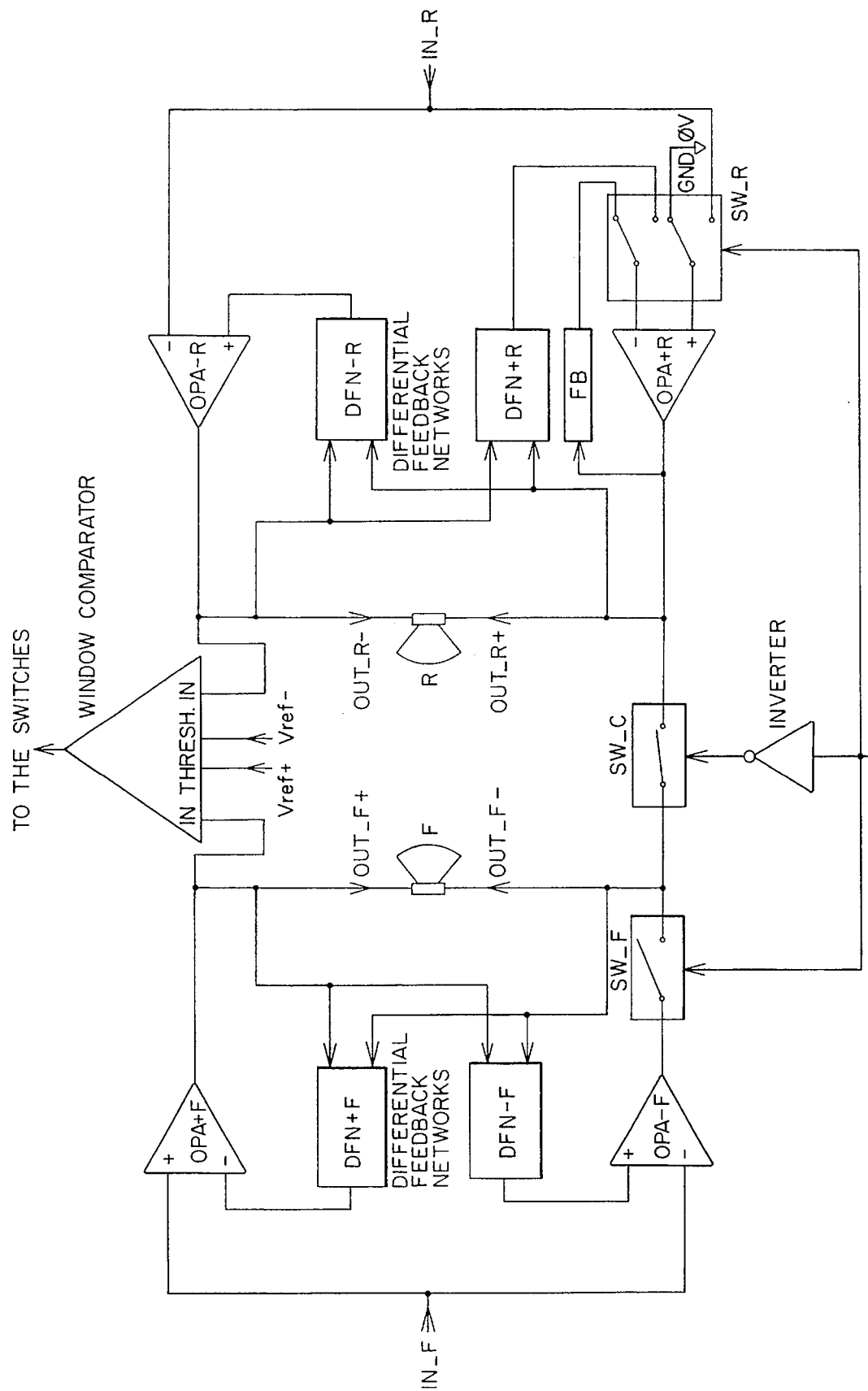
FIG. 4 shows an alternative embodiment of a self-configurable, dual bridge amplifier of the invention wherein the configuring window comparator uses the signals of the output nodes of the amplifiers rather than the signals of the input nodes thereof.
Figure 5:
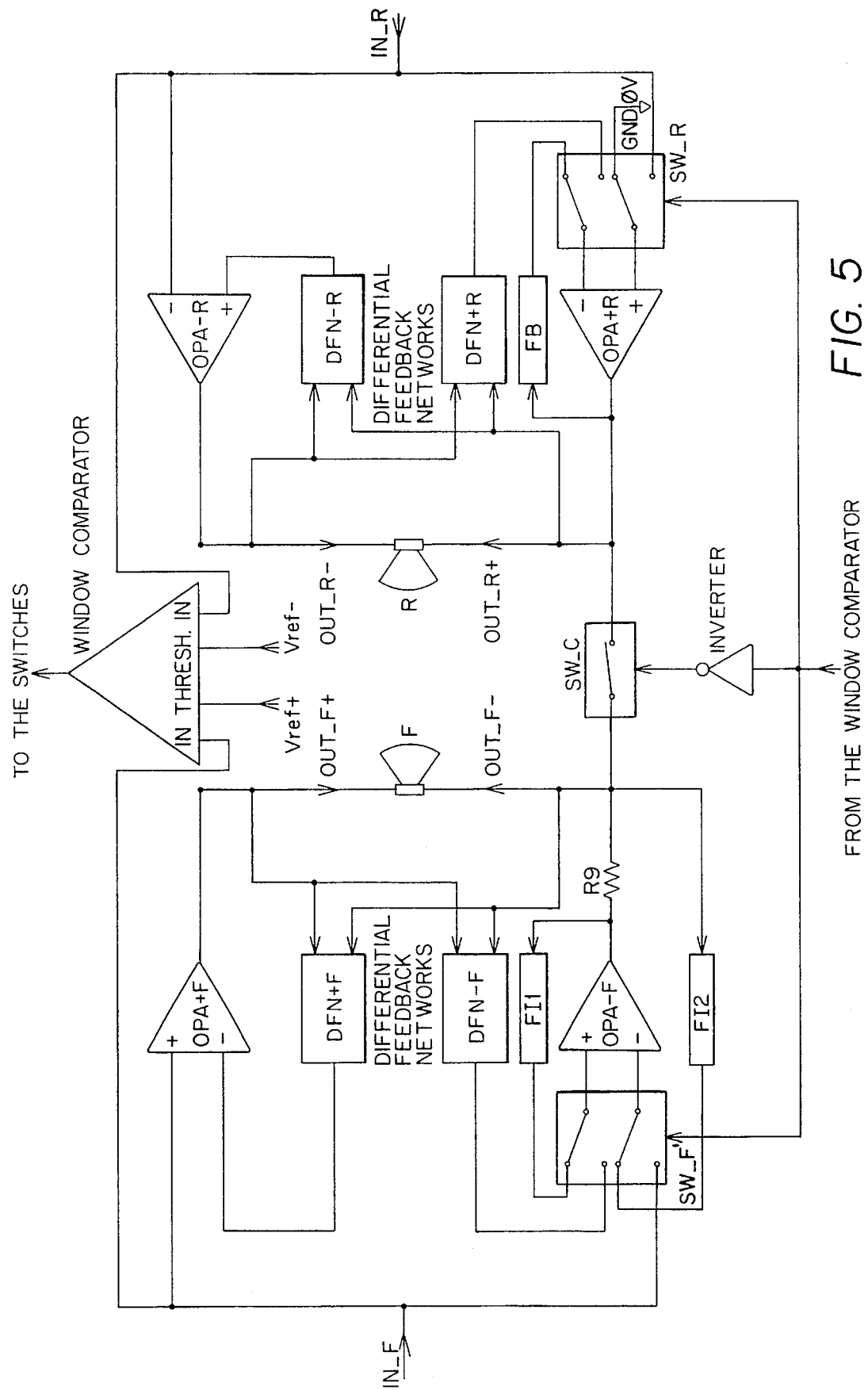
FIG. 5 is a block diagram of an alternative embodiment of the self-configurable, dual bridge amplifier of the invention.

FIG. 5 shows a functional diagram of another embodiment of the invention, wherein, the function of the power switch SW_F of the functional diagrams of FIGS. 1 and 4, does not require the integration of a power device (typically a power MOS transistor) for implementing the switch SW_F. Moreover, this alternative embodiment, does not require the use of an operational amplifier (OPA–F) incorporating a circuit capable of determining a so-called "tristate" condition of operation, i.e., a condition of a high output impedance.

This important result is obtained by connecting a resistance R9 having a relatively low value, in series to the output of the operational amplifier OPA–F and by realizing two buffer feedback networks: FI1 and FI2, that are connected to the output of the amplifier OPA–F, before and after, respectively, the series resistance R9. A two-pole switch SW_F', driven by the signal generated by the configuring comparator, switches the inputs of the operational amplifier OPA–F to said buffer feedback lines when the instantaneous level of the input signals of the amplifier remains within the "window" determined by the two reference voltages (positive and negative) Vref+ and Vref– applied to the comparator.

Figure 6:
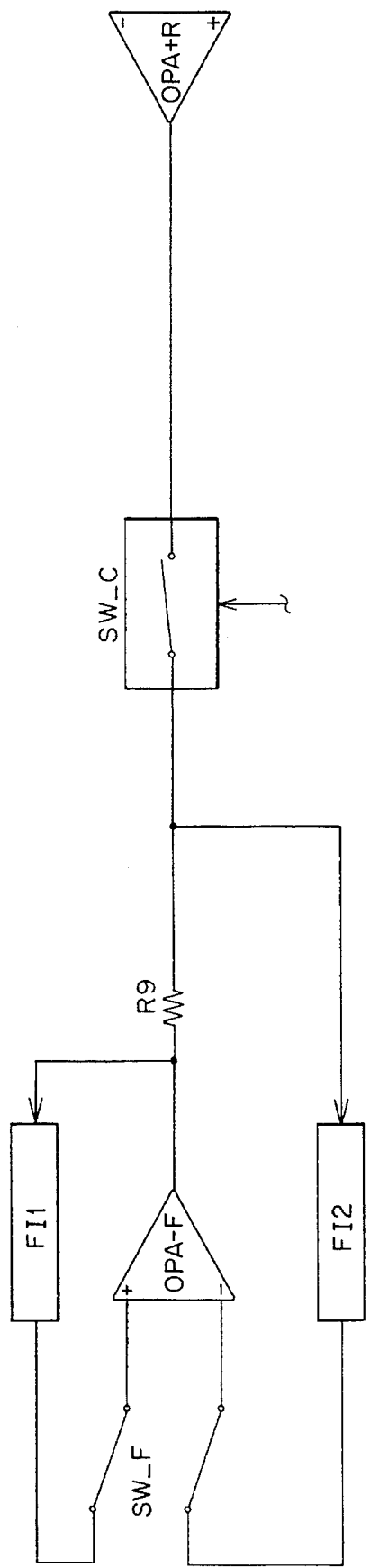
FIG. 6 is a partial block diagram showing the operation of the peculiar self-configuring system of the amplifier of FIG. 5.

In this condition, the operational amplifier OPA–F is configured as shown in the partial diagram of FIG. 6.

In this configuration, the operational amplifier OPA–F is normally powered, but because of the feedback loops connected to the output node of the amplifier before and after the series connected resistance R9 (having a relatively low value, for example 0.12), the current that the amplifier may deliver through its output is virtually null ($\cong$Voffset/R9). Therefore, the potential assumed by the output node is substantially determined by the rest of the circuit, i.e., by the other operational amplifier OPA+R and by the switch SW_C.

Figure 7:
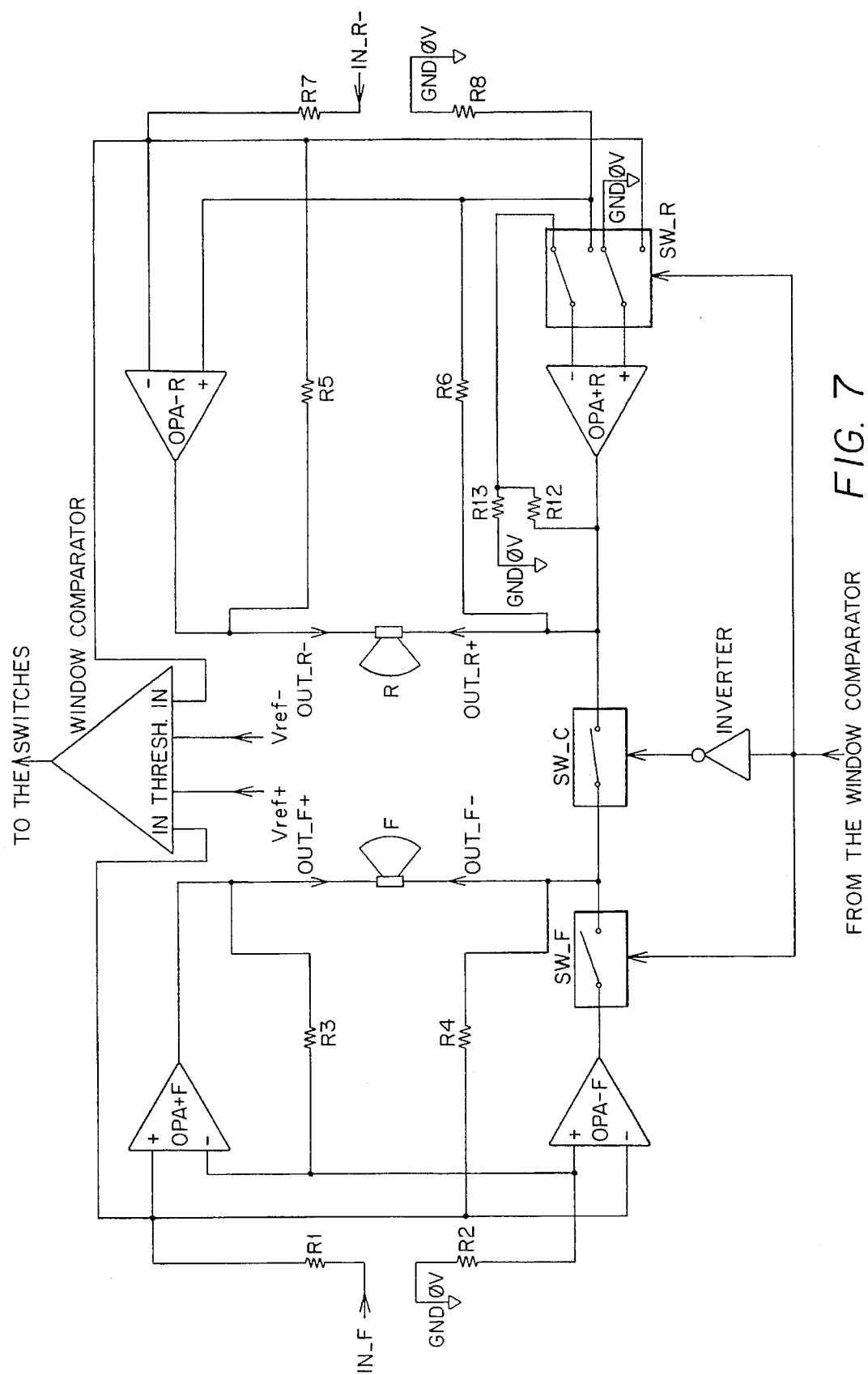
FIG. 7 is a diagram of the amplifier of FIG. 1, wherein selectable feedback loops of the amplifiers are shown in detail.

A circuit diagram of the diagram of FIG. 1, is shown in FIG. 7, wherein an embodiment of the feedback lines of the four operational power amplifiers is shown.

Figure 8:
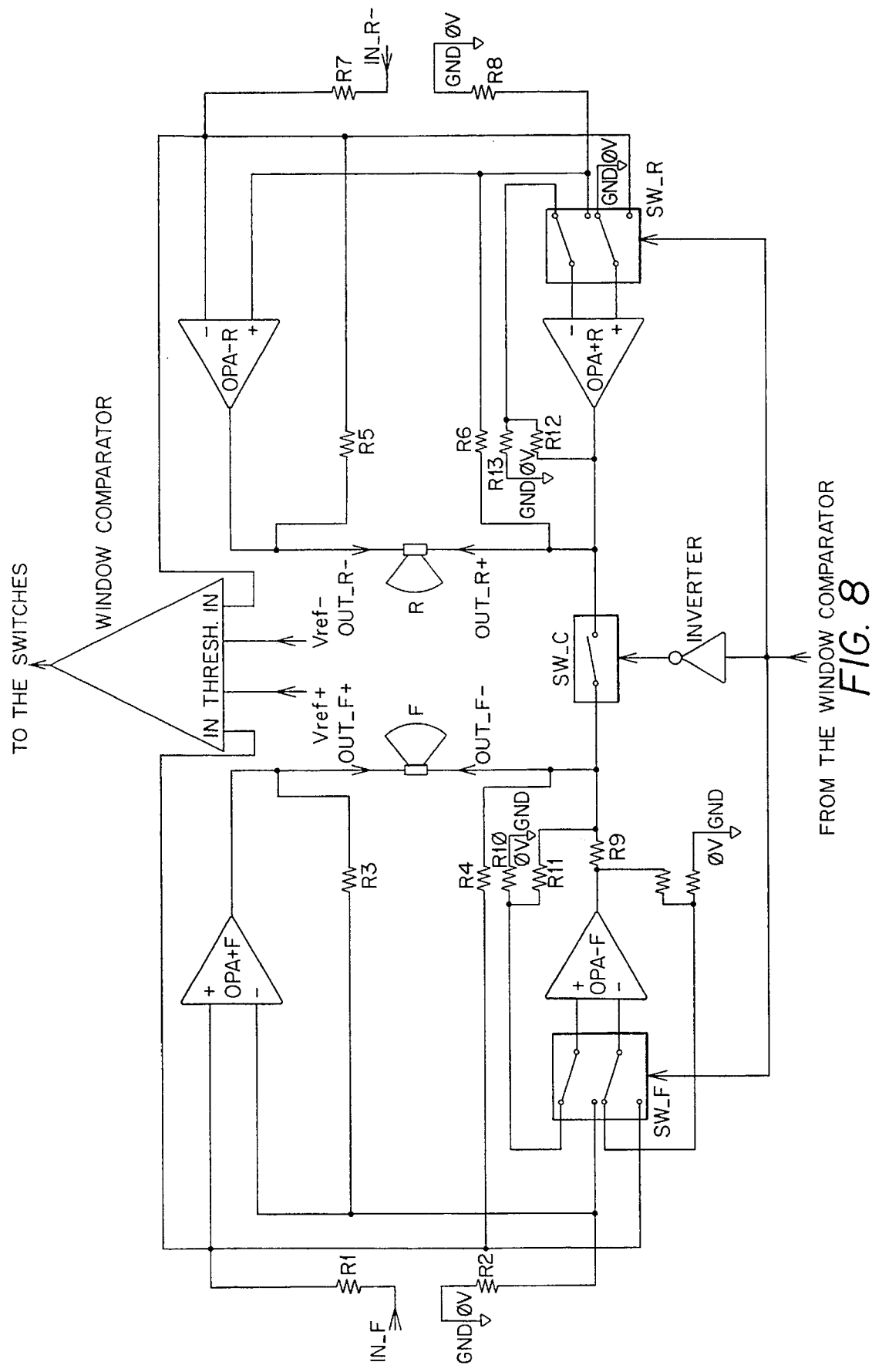
FIG. 8 shows the circuit of the amplifier of FIG. 5, wherein the feedback loops of the four power amplifiers are shown in detail.

A circuit diagram of the diagram of FIG. 5 is shown in FIG. 8, wherein the feedback lines of the four operational power amplifiers are shown in detail.

Figure 9:
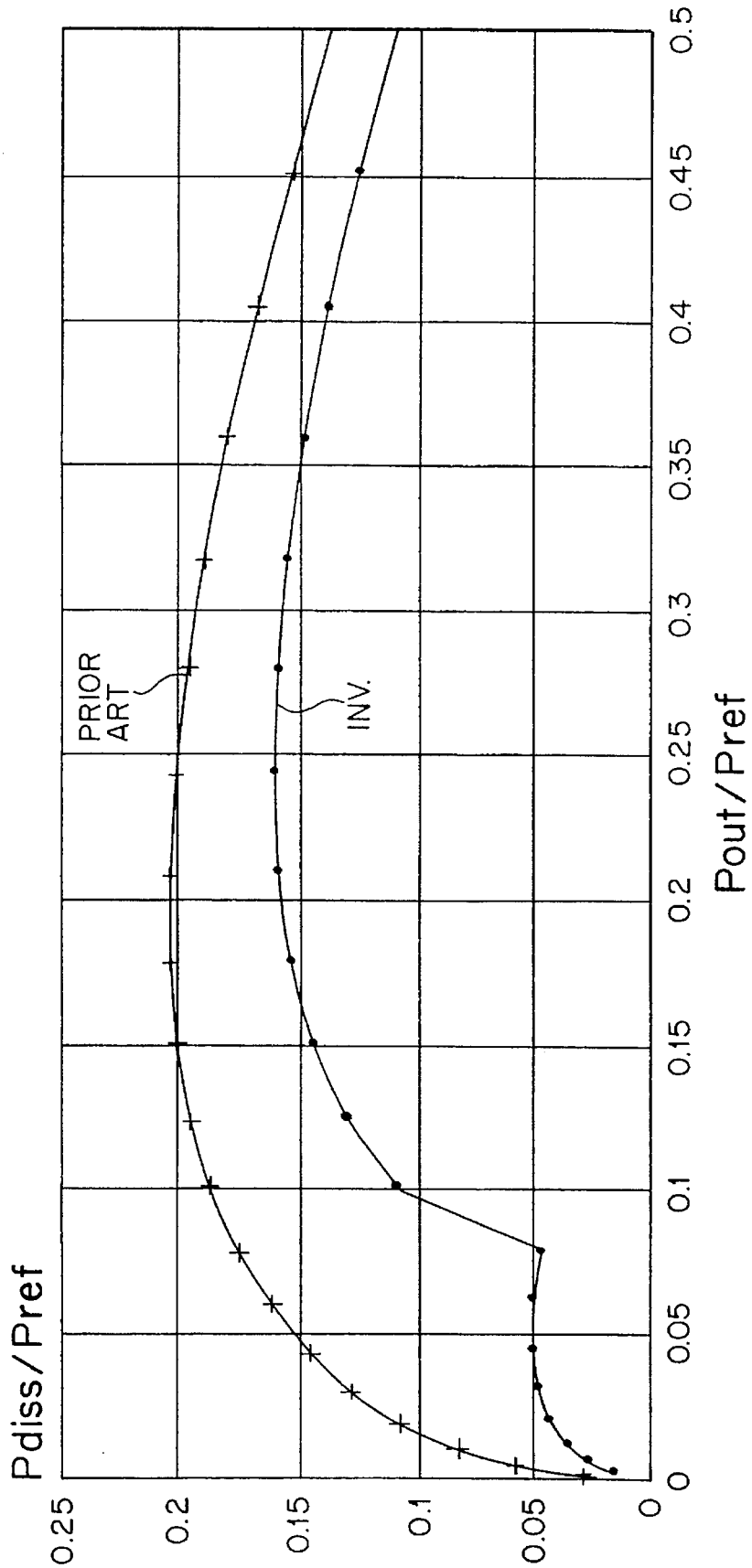
FIG. 9 shows a normalized diagram of the power dissipation in function of the output power of a self-configurable, dual bridge amplifier of the invention and of a comparable dual bridge amplifier, made according to the prior art.

The reduction of the dissipated power provided by a self-configurable, dual bridge amplifier of the present invention as compared to a dual bridge amplifier of functionally identical characteristics, but without the self-configuring system of the invention, is graphically shown in FIG. 9. Normalized diagrams of the power dissipation in function of the output power in the case of a conventional type dual bridge amplifier (prior art) and in the case of a self-configurable amplifier of the invention (INV) are shown in the figure.

The self-configurable, dual bridge amplifier of the invention may be entirely integrated and essentially does not require the use of additional components that cannot be integrated, such as large capacitors.

Of course, a self-configurable, dual bridge amplifier made in accordance with the present invention may also be provided with common mode feedback loops, in accordance with techniques and practices that are well known to a person skilled in the art.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is limited only as defined in the following claims and the equivalents thereto.

What is claimed is:

1. A self-configurable amplifier for driving a first load and a second load, the self-configurable amplifier comprising:

an amplifying circuit that is connectable to the loads, to receive a first signal and a second signal, and drive the loads according to the signals; and comparing and configuring means, coupled to the amplifying circuit, for comparing each of the first signal and the second signal to a predetermined signal range and configuring the amplifying circuit and the loads in a first configuration when each of the first signal and the second signal is within the predetermined signal range, and a second configuration when at least one of the first signal and the second signal is outside the predetermined signal range.

2. The self-configurable amplifier of claim 1, wherein the comparing and configuring means includes:

means for providing a control signal according to a result of a comparison of the first signal and the second signal to the predetermined signal range; and means, responsive to the control signal, for arranging the amplifying circuit and the loads into the first configuration and the second configuration when the control signal is in a first state and a second state, respectively.

3. The self-configurable amplifier of claim 2, wherein the means for arranging includes:

means for disconnecting the first load from the second load when the control signal is in the first state, and providing a conducting path between the first load and the second load to connect the loads in series when the control signal is in the second state.

4. The self-configurable amplifier of claim 2, wherein the amplifying circuit includes a plurality of amplifying elements; and wherein the means for arranging includes:

means for activating one of the plurality of amplifying elements when the control signal is in the first state, and deactivating the one of the plurality of amplifying elements when the control signal is in the second state.

5. The self-configurable amplifier of claim 2, wherein the amplifying circuit includes a plurality of amplifying elements; and wherein the means for arranging includes:

means for configuring one of the plurality of amplifying elements as a signal amplifier when the control signal is in the first state, and configuring the one of the plurality of amplifying elements as a current buffer when the control signal is in the second state.

6. A self-configurable amplifier for driving a first load and a second load, the self-configurable amplifier comprising:

an amplifying circuit that is connectable to the loads, to receive a first signal and a second signal, and drive the loads according to the signals; and a control circuit coupled to the amplifying circuit, to compare each of the first signal and the second signal to a predetermined signal range, and configure the amplifying circuit and the loads in a first configuration when each of the first signal and the second signal is within the predetermined signal range, and a second configuration when at least one of the first signal and the second signal is outside the predetermined signal range.

7. The self-configurable amplifier of claim 6, wherein the control circuit includes:

a comparator circuit having a first input to receive the first signal, a second input to receive the second signal, and an output to provide a control signal according to a result of a comparison of the first signal and the second signal to the predetermined signal range; and a plurality of switches coupled to the amplifying circuit and the output of the comparator circuit, to arrange the amplifying circuit and the loads in the first and the second configurations when the control signal is in a first state and a second state, respectively.

8. The self-configurable amplifier of claim 7, wherein the plurality of switches includes:

a switch having a first terminal coupled to the first load, a second terminal coupled to the second load, and a control input coupled to the output of the comparator circuit.

9. The self-configurable amplifier of claim 7, wherein the amplifying circuit includes a plurality of amplifying elements; and wherein the plurality of switches includes:

a switch having a control input coupled to the output of the comparator circuit, and a pair of terminals coupled to one of the plurality of amplifying elements, to activate the one of the plurality of amplifying elements when the control signal is in the first state, and deactivate the one of the plurality of amplifying elements when the control signal is in the second state.

10. The self-configurable amplifier of claim 7, wherein the amplifying circuit includes a plurality of amplifying elements; and wherein the plurality of switches includes:

a switch having a control input coupled to the output of the comparator circuit, and a pair of terminals coupled to one of the plurality of amplifying elements, to configure the one of the plurality of amplifying elements as a signal amplifier when the control signal is in the first state, and as a current buffer when the control signal is in the second state.

11. A method for driving a first load and a second load, the method comprising the steps of:

(a) receiving a first signal and a second signal;

(b) comparing each of the first signal and the second signal to a predetermined signal range and configuring the first and second loads and an amplifying circuit in a first configuration when each of the first signal and the second signal is within the predetermined signal range, and a second configuration when at least one of the first signal and the second signal is outside the predetermined signal range; and (c) driving the loads according to the first signal and the second signal.

12. The method of claim 11, wherein the step of comparing and configuring the first and second loads includes the step of:

providing a control signal according to a result of a comparison of the first signal and the second signal to the predetermined range; and arranging the amplifying circuit and the loads into the first configuration and the second configuration when the control signal is in a first state and a second state, respectively.

13. The method of claim 12, wherein the step of arranging includes the step of:

disconnecting the first load from the second load when the control signal is in the first state, and providing a conducting path between the first load and the second load to connect the loads in series when the control signal is in the second state.

14. The method of claim 12, wherein the amplifying circuit includes a plurality of amplifying elements, and wherein the step of arranging includes the step of:

activating one of the plurality of amplifying elements when the control signal is in the first state, and deactivating the one of a plurality of amplifying elements when the control signal is in the second state.

15. The method of claim 12, wherein the amplifying circuit includes a plurality of amplifying elements, and wherein the step of arranging includes the step of:

configuring one of the plurality of the amplifying elements as a signal amplifier when the control signal is in the first state, and as a current buffer when the control signal is in the second state.

16. An audio system, comprising:

a first speaker and a second speaker;

a signal source to provide a first signal and a second signal;

an amplifying circuit coupled to the speakers and the signal source, to receive the first signal and the second signal, and drive the speakers according to the signals; and comparing and configuring means, coupled to the amplifying circuit and the speakers, for comparing each of the first signal and the second signal to a predetermined signal range, and configuring the amplifying circuit and the speakers in a first configuration when each of the first signal and the second signal is within the predetermined signal range, and a second configuration when at least one of the first signal and the second signal is outside the predetermined signal range.

17. The audio system of claim 16, wherein the comparing and configuring means includes:

means for providing a control signal according to a result of a comparison of the first signal and the second signal to the predetermined signal range; and means, responsive to the control signal, for arranging the amplifying circuit and the speakers into the first configuration and the second configuration when the control signal is in a first state and a second state, respectively.

18. The audio system of claim 17, wherein the means for arranging includes:

means for disconnecting the first speaker from the second speaker when the control signal is in the first state, and providing a conducting path between the first speaker and the second speaker to connect the speakers in series when the control signal is in the second state.

19. The audio system of claim 17, wherein the amplifying circuit includes a plurality of amplifying elements; and wherein the means for arranging includes:

means for activating one of the plurality of amplifying elements when the control signal is in the first state, and deactivating the one of the plurality of amplifying elements when the control signal is in the second state.

20. The audio system of claim 17, wherein the amplifying circuit includes a plurality of amplifying elements; and wherein the means for arranging includes:

means for configuring one of the plurality of amplifying elements as a signal amplifier when the control signal is in the first state, and configuring the one of the plurality of amplifying elements as a current buffer when the control signal is in the second state.

21. An audio system, comprising:

a first speaker and a second speaker;

a signal source to provide a first signal and a second signal;

an amplifying circuit coupled to the speakers and the signal source, to receive the first signal and the second signal, and drive the speakers according to the signals; and a control circuit coupled to the amplifying circuit and the speakers, to compare each of the first signal and the second signal to a predetermined signal range, and configure the amplifying circuit and the speakers in a first configuration when each of the first signal and the second signal is within the predetermined signal range, and a second configuration when at least one of the first signal and the second signal is outside the predetermined signal range.

22. The audio system of claim 21, wherein the control circuit includes:

a comparator circuit having a first input to receive the first signal, a second input to receive the second signal, and an output to provide a control signal according to a result of a comparison of the first signal and the second signal to the predetermined signal range; and a plurality of switches coupled to the amplifying circuit, the speakers, and the output of the comparator circuit, to arrange the amplifying circuit and the speakers in the first and the second configurations when the control signal is in a first state and a second state, respectively.

23. The audio system of claim 22, wherein the plurality of switches includes:

a switch having a first terminal connected to the first speaker, a second terminal connected to the second speaker, and a control input coupled to the output of the comparator circuit.

24. The audio system of claim 22, wherein the amplifying circuit includes a plurality of amplifying elements; and wherein the plurality of switches includes:

a switch having a control input coupled to the output of the comparator circuit, and a pair of terminals coupled to one of the plurality of amplifying elements, to activate the one of the plurality of amplifying elements when the control signal is in the first state, and deactivate the one of the plurality of amplifying elements when the control signal is in the second state.

25. The audio system of claim 22, wherein the amplifying circuit includes a plurality of amplifying elements; and wherein the plurality of switches includes:

a switch having a control input coupled to the output of the comparator circuit, and a pair of terminals coupled to one of the plurality of amplifying elements, to configure the one of the plurality of amplifying elements as a signal amplifier when the control signal is in the first state, and as a current buffer when the control signal is in the second state.

* * * * *